United States Patent
Paul et al.

(10) Patent No.: US 11,948,978 B2
(45) Date of Patent: Apr. 2, 2024

(54) FIELD-EFFECT TRANSISTORS (FETS) EMPLOYING EDGE TRANSISTOR CURRENT LEAKAGE SUPPRESSION TO REDUCE FET CURRENT LEAKAGE

(71) Applicant: QUALCOMM Incorporated, San Diego, CA (US)

(72) Inventors: Abhijeet Paul, Escondido, CA (US); Mishel Matloubian, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/857,703

(22) Filed: Apr. 24, 2020

(65) Prior Publication Data

US 2021/0336008 A1    Oct. 28, 2021

(51) Int. Cl.
*H01L 29/10*    (2006.01)
*H01L 29/66*    (2006.01)

(52) U.S. Cl.
CPC ...... *H01L 29/1083* (2013.01); *H01L 29/1041* (2013.01); *H01L 29/66477* (2013.01)

(58) Field of Classification Search
CPC ............ H01L 29/0607; H01L 29/0649; H01L 29/0696; H01L 29/0843; H01L 29/0865–0869; H01L 29/0882–0886; H01L 29/0891; H01L 29/1029–1058; H01L 29/41758; H01L 29/42312–42396; H01L 29/49–518; H01L 29/66598; H01L 29/66636; H01L 29/66643; H01L 29/66651; H01L 29/66659; H01L 29/435;
(Continued)

(56) References Cited

U.S. PATENT DOCUMENTS 4,714,519 A * 12/1987 Pfiester ............ H01L 21/28105
                                                    438/596
5,729,039 A * 3/1998 Beyer ............... H01L 29/41783
                                                    257/347

(Continued)

OTHER PUBLICATIONS

International Search Report and Written Opinion for International Patent Application No. PCT/US2021/024112, dated Jun. 14, 2021, 16 pages.

*Primary Examiner* — Natalia A Gondarenko
(74) *Attorney, Agent, or Firm* — Withrow & Terranova, PLLC

(57) ABSTRACT

Field-effect transistors (FETs) employing edge transistor current leakage suppression to reduce FET current leakage, and related methods, are disclosed. The FET includes a gate that includes extended-length edge gate regions overlapping semiconductor layer edges to form extended length edge conduction channels in edge transistors. In this manner, the threshold voltage of the edges transistors is increased, thus reducing current leakage of the edges transistors and overall current leakage of the FET. In another aspect, a body connection implant that is formed to short a source or drain region to a body of the FET is extended in length to form body connection implant regions underneath at least a portion of the edge gate regions. In this manner, the work functions of the edge gate regions are increased in voltage thus increasing the threshold voltage of the edge transistors and reducing current leakage of the edges transistors and the FET.

12 Claims, 12 Drawing Sheets

(58) Field of Classification Search
CPC ........... H01L 29/66848; H01L 29/8126; H01L
29/7841; H01L 29/1095; H01L 29/4238;
H01L 29/7725; H01L 29/775; H01L
29/778; H01L 29/7833–7836; H01L
29/8615; H01L 29/78624; H01L
29/78696; H01L 29/1083; H01L 29/1075;
H01L 29/1025; H01L 29/1033; H01L
29/66477; H01L 29/66575; H01L
29/41775; H01L 29/41725; H01L
29/42372; H01L 29/42376; H01L
29/1041; H01L 29/78; H01L 27/092
USPC ................... 257/288, 347, 57, 66, 349, 348
See application file for complete search history.

(56) References Cited

U.S. PATENT DOCUMENTS

| | | | |
|---|---|---|---|
| 6,239,649 | B1 | 5/2001 | Bertin et al. |
| 8,072,030 | B2 * | 12/2011 | Sugiura ............... H01L 27/0248 |
| | | | 257/E29.12 |
| 10,115,787 | B1 | 10/2018 | Paul et al. |
| 2001/0045602 | A1 * | 11/2001 | Maeda ................. H01L 27/1203 |
| | | | 257/349 |
| 2002/0109187 | A1 * | 8/2002 | Matsumoto ....... H01L 21/76264 |
| | | | 257/349 |
| 2003/0025159 | A1 * | 2/2003 | Hogyoku .......... H01L 29/66772 |
| | | | 257/347 |
| 2013/0105885 | A1 | 5/2013 | Flachowsky et al. |
| 2018/0366542 | A1 * | 12/2018 | Paul ................. H01L 29/66545 |
| 2019/0088781 | A1 * | 3/2019 | Brindle ............... H01L 29/7841 |
| 2019/0296119 | A1 | 9/2019 | Kasai |
| 2020/0357886 | A1 * | 11/2020 | Shi ..................... H01L 27/1203 |

\* cited by examiner

FIELD-EFFECT TRANSISTORS (FETS) EMPLOYING EDGE TRANSISTOR CURRENT LEAKAGE SUPPRESSION TO REDUCE FET CURRENT LEAKAGE

BACKGROUND

I. Field of the Disclosure

The field of the disclosure relates field-effect transistors (FETs), and more particularly to FET designs to manage leakage current.

II. Background

Transistors are essential components in modern electronic devices, and large numbers of transistors are employed in integrated circuits (ICs) therein. For example, components such as central processing units (CPUs) and memory systems each employ a large quantity of transistors for logic circuits and memory devices. Transistors are also employed in radio-frequency (RF) devices, such as modern smart phones, and other portable devices have extended the use of different wireless links with a variety of technologies in different radio frequency bands.

FETs can be formed as silicon-on-insulator (SOI) substrate FETs. SOI substrate FETs are formed in thin layers of silicon that are isolated from the main body of the SOI wafer handle substrate by a layer of an electrical insulator, usually silicon dioxide. The silicon layer thickness ranges from several microns (i.e., micrometers ($\mu$m) for electrical power switching devices to less than five hundred (500) Angstroms for high-performance microprocessors. Isolating an active transistor from the rest of a silicon substrate reduces electrical current leakage that would otherwise degrade the performance of the transistor. Since the area of electrically active silicon is limited to the immediate region around the transistor, switching speeds are increased and sensitivity to "soft errors" is greatly reduced. SOT substrate FETs have the advantage over bulk substrate FETs of higher speed, lower power consumption, and improved RF performance. SOI substrate FETs can be formed as dielectrically-isolated complementary metal oxide semiconductor (CMOS) P-type and N-type FETs.

FIGS. 1A and 1B illustrate top/plan and side views of an exemplary cell circuit 100 that includes CMOS circuits formed from SOI substrate FETs to provide integrated circuits (ICs). FIG. 1B illustrates a side view of the cell circuit 100 in FIG. 1A across the $A_1$-$A_1'$ axis. As shown in FIG. 1A, the cell circuit 100 includes a layout on X-axis and Y-axis dimensions that includes a P-type semiconductor diffusion region ("P-type diffusion region") 102P and an N-type semiconductor diffusion region ("N-type diffusion region") 102N. As shown in FIGS. 1A and 1B, the P-type diffusion region 102P and N-type diffusion region 102N formed of respective P-type and N-type silicon layers 104P, 104N (also known as "silicon islands") are formed on a buried oxide (BOX) layer 106 as part of an SOI substrate 108 to provide active areas for forming a respective P-type FET (PFET) 110P and N-type FET (NFET) 110N. A gate 112 comprising an insulator (e.g., an oxide layer) and an overlaying gate material (e.g., polysilicon) are formed over the P-type diffusion region 102P and N-type diffusion region 102N. Regarding the P-type diffusion region 102P, a P-type source region 114S-P and P-type drain region 114D-P are formed over the respective P-type diffusion region 102P on opposite sides of the gate 112 by implanting or diffusing P+ material over the P-type diffusion region 102P to form the PFET 110P. The region between the P-type source region 114S-P and P-type drain region 114D-P in the P-type silicon layer 104P forms a conduction channel 116P of the PFET 110P. The region between the N-type source region 114S-N and N-type drain region 114D-N in the N-type silicon layer 104N forms a conduction channel 116N of the NFET 110N.

As shown in FIG. 1B, the process of forming a gate material 118 over the SOI substrate 108 leaves two (2) opposing width-wise edges 120(1), 120(2) in the P-type diffusion region 102P. This is because during the fabrication of the cell circuit 100, the implant of the P+ material over the P-type diffusion region 102P segregates from the respective silicon layer 104P at the edges 120(1), 120(2) adjacent to the shallow trench isolation (STI) to be lower than in the central region of the conduction channel 116P due to the thinness of the silicon layer 104P and at the edges of the silicon layer 104P due to silicon consumption during STI formation. This reduction in the P+ material implant at the edges 120(1), 120(2) results in a reduction in threshold voltage of the edge of the conduction channel 116P at the edges 120(1), 120(2) due to the band gap at the edges 120(1), 120(2) being bent downward, typically by several tenths of a Volt (V). Leakage current increases approximately at the rate of a decade of the current for every 67 millivolts (mV) of band bending. Hence, this implant depletion at the edges 120(1), 120(2) of the PFET 110P may cause leakage current at the edges 120(1), 120(2). It may be desired to reduce the channel lengths of FETs formed in the cell circuit 100 to increased switching speed. However, the threshold voltage also reduces with reduced channel length thus contributing to increased leakage current. The leakage current as a result of decreased channel lengths coupled with leakage current due to the edges 120(1), 120(2) may provide leakage current that is not tolerable for a given IC formed from the FETs.

SUMMARY OF TIE DISCLOSURE

Aspects disclosed herein include field-effect transistors (FETs) employing edge transistor current leakage suppression to reduce FET current leakage, and related methods. A FET is provided that includes a conduction channel formed from a semiconductor layer or body (i.e., silicon). The FET may be a silicon-on-insulator (SOI) FET as an example. A source and drain region are formed on opposite sides of the conduction channel in the semiconductor layer by implanting or diffusing doping material in the semiconductor layer. A gate is formed on an insulating layer that is disposed adjacent to the conduction channel to generate an electric field in the conduction channel and control the flow of current in the conduction channel. The conduction channel includes edge conduction channels that are formed at the edges of a gate that overlaps the semiconductor layer, thus effectively forming "edge transistors" in the FET. These gate edges cause the implant or diffusion concentration at the gate edges to be reduced and thus reducing the threshold voltage at the edge transistors, and which reduces the threshold voltage of the FET resulting in increased current leakage.

In this regard, in exemplary aspects disclosed herein, to reduce current leakage of the FET, the FET includes a gate that includes edge gate regions overlapping the semiconductor layer that are extended in length to form extended length edge conduction channels in edge transistors of the FET. In this manner, the threshold voltage of the edge transistors is increased, thus reducing the current leakage of the edge transistors and the overall current leakage of the FET. In additional exemplary aspects disclosed herein, to further reduce current leakage of the FET, a body connection implant that is formed to short the source or drain region to the body of the FET and of an opposite polarity to the source or drain implant, is extended in length to form edge body connection implant regions within at least a portion of the edge gate regions. By forming the edge body connection implant regions, the work function of the edge gate regions is increased in voltage thus increasing the threshold voltage of the edge transistors of the FET, increasing the threshold voltage of the edge gate regions reduces the current leakage of the edge transistors and the overall current leakage of the FET.

In other exemplary aspects, the area of the edge gate regions of the gate can be controlled to control the parasitic capacitance of the FET. The parasitic capacitance of the FET is affected by the area of the gate on the active region and the distance between the gate and the source or drain implants. The shape of the edge gate regions of the gate can be designed to provide the desired extended length overlapping the semiconductor layer, but also designed to control the area of the edge gate regions to control the overall area of the gate.

In this regard, in one exemplary aspect, a FET is provided. The FET comprises a semiconductor layer comprising a semiconductor material. The FET also comprises a gate disposed above the semiconductor layer. The gate comprises a central gate region disposed above a first region of the semiconductor layer to form a central conduction channel in the first region of the semiconductor layer. The central gate region is disposed along a first longitudinal axis and having a first end and a second end opposite the first end, the central gate region having a first length along a second longitudinal axis orthogonal to the first longitudinal axis. The gate also comprises an edge gate region overlying an end region of the semiconductor layer to form an edge conduction channel in the end region of the semiconductor layer. The edge gate region disposed along the second longitudinal axis orthogonal to the first longitudinal axis, and disposed adjacent to the first end of the central gate region, the edge gate region having a second length longer than the first length. The FET also comprises a source region of a first polarity within the semiconductor layer and disposed on a first side of the central conduction channel along a third longitudinal axis orthogonal to the first longitudinal axis. The FET also comprises a drain region of the first polarity within the semiconductor layer and disposed on a second side of the central conduction channel opposite the first side of the central conduction channel and along the third longitudinal axis. The FET also comprises a central transistor defined by the central gate region disposed over the semiconductor layer, the central transistor having a first threshold voltage. The FET also comprises an edge transistor defined by the edge gate region disposed over the semiconductor layer, the edge transistor having a second threshold voltage. The FET also comprises an implant of a second polarity opposite the first polarity and disposed along a fourth longitudinal axis parallel to the second longitudinal axis, and underlying at least a portion of the edge gate region to the first end of the central gate region.

In another exemplary aspect, a method of fabricating a FET is provided. The method comprises forming a semiconductor layer comprising a semiconductor material. The method also comprises forming a gate above the semiconductor layer, the gate comprising a central gate region disposed above a first region of the semiconductor layer to form a central conduction channel in the first region of the semiconductor layer, the central gate region disposed along a first longitudinal axis and having a first end and a second end opposite the first end, the central gate region having a first length along a second longitudinal axis orthogonal to the first longitudinal axis, and an edge gate region overlying an end region of the semiconductor layer to form an edge conduction channel in the end region of the semiconductor layer, the edge gate region disposed along the second longitudinal axis orthogonal to the first longitudinal axis, and disposed adjacent to the first end of the central gate region, the edge gate region having a second length longer than the first length. The method also comprises forming a source region of a first polarity within the semiconductor layer on a first side of the central conduction channel along a third longitudinal axis orthogonal to the first longitudinal axis. The method also comprises forming a drain region of the first polarity within the semiconductor layer on a second side of the central conduction channel opposite the first side of the central conduction channel and along the third longitudinal axis. The method also comprises forming an implant of a second polarity opposite the first polarity along a fourth longitudinal axis parallel to the second longitudinal axis, and underlying at least a portion of the edge gate region to the first end of the central gate region.

In another exemplary aspect, a complementary metal oxide semiconductor (CMOS) circuit is provided. The CMOS circuit comprises a substrate. The CMOS circuit also comprises a semiconductor layer comprising a semiconductor material disposed above the substrate. The CMOS circuit also comprises a P-type diffusion region disposed in the semiconductor layer. The CMOS circuit also comprises at least one P-type field-effect transistor (FET) (PFET) in the P-type diffusion region each comprising a first gate disposed above the P-type diffusion region. The first gate comprises a first central gate region disposed above a first region of the semiconductor layer to form an N-type central conduction channel in the first region of the semiconductor layer, the first central gate region disposed along a first longitudinal axis and having a first end and a second end opposite the first end, the first central gate region having a first length along a second longitudinal axis orthogonal to the first longitudinal axis, and a first edge gate region disposed above a second region of the semiconductor layer to form an N-type edge conduction channel in the second region of the semiconductor layer, the first edge gate region disposed along the second longitudinal axis orthogonal to the first longitudinal axis, and disposed adjacent to the first end of the first central gate region, the first edge gate region having a second length longer than the first length. Each of the at least one PFET also comprises a P-type source region within the semiconductor layer and disposed on a first side of the N-type central conduction channel along a third longitudinal axis orthogonal to the first longitudinal axis. Each of the at least one PFET also comprises a P-type drain region within the semiconductor layer and disposed on a second side of the N-type central conduction channel opposite the first side of the N-type central conduction channel and along the third longitudinal axis, a P-type central transistor defined by the first central gate region disposed over the semiconductor layer, the P-type central transistor having a first threshold voltage, a P-type edge transistor defined by the first edge gate region disposed over the semiconductor layer, the P-type edge transistor having a second threshold voltage, and an N-type implant disposed along a fourth longitudinal axis parallel to the second longitudinal axis, and underlying at least a portion of the first edge gate region to the first end of the first central gate region.

The CMOS circuit also comprises an N-type diffusion region disposed in the semiconductor layer. The N-type diffusion region at least one NFET in the N-type diffusion region. Each of the at least one NFET comprises a second gate disposed above the N-type diffusion region, the second gate comprising a second central gate region disposed above a third region of the semiconductor layer to form a P-type central conduction channel in the third region of the semiconductor layer, the second central gate region disposed along a fifth longitudinal axis and having a first end and a second end opposite the first end, the second central gate region having a third length along a sixth longitudinal axis orthogonal to the fifth longitudinal axis, and a second edge gate region disposed above a fourth region of the semiconductor layer to form a P-type edge conduction channel in the fourth region of the semiconductor layer, the second edge gate region disposed along the sixth longitudinal axis orthogonal to the fifth longitudinal axis, and disposed adjacent to the first end of the second central gate region, the second edge gate region having a fourth length longer than the third length. Each of the at least one NFET also comprises an N-type source region within the semiconductor layer and disposed on a first side of the P-type central conduction channel along a seventh longitudinal axis orthogonal to the fifth longitudinal axis, an N-type drain region within the semiconductor layer and disposed on a second side of the P-type central conduction channel opposite the first side of the P-type central conduction channel and along the seventh longitudinal axis, an N-type central transistor defined by the second central gate region disposed over the semiconductor layer, the N-type central transistor having a third threshold voltage, an N-type edge transistor defined by the second edge gate region disposed over the semiconductor layer, the N-type edge transistor having a fourth threshold voltage, and a P-type implant disposed along an eighth longitudinal axis parallel to the sixth longitudinal axis, and underlying at least a portion of the second edge gate region to the first end of the second central gate region.

DETAILED DESCRIPTION

Figure 1:
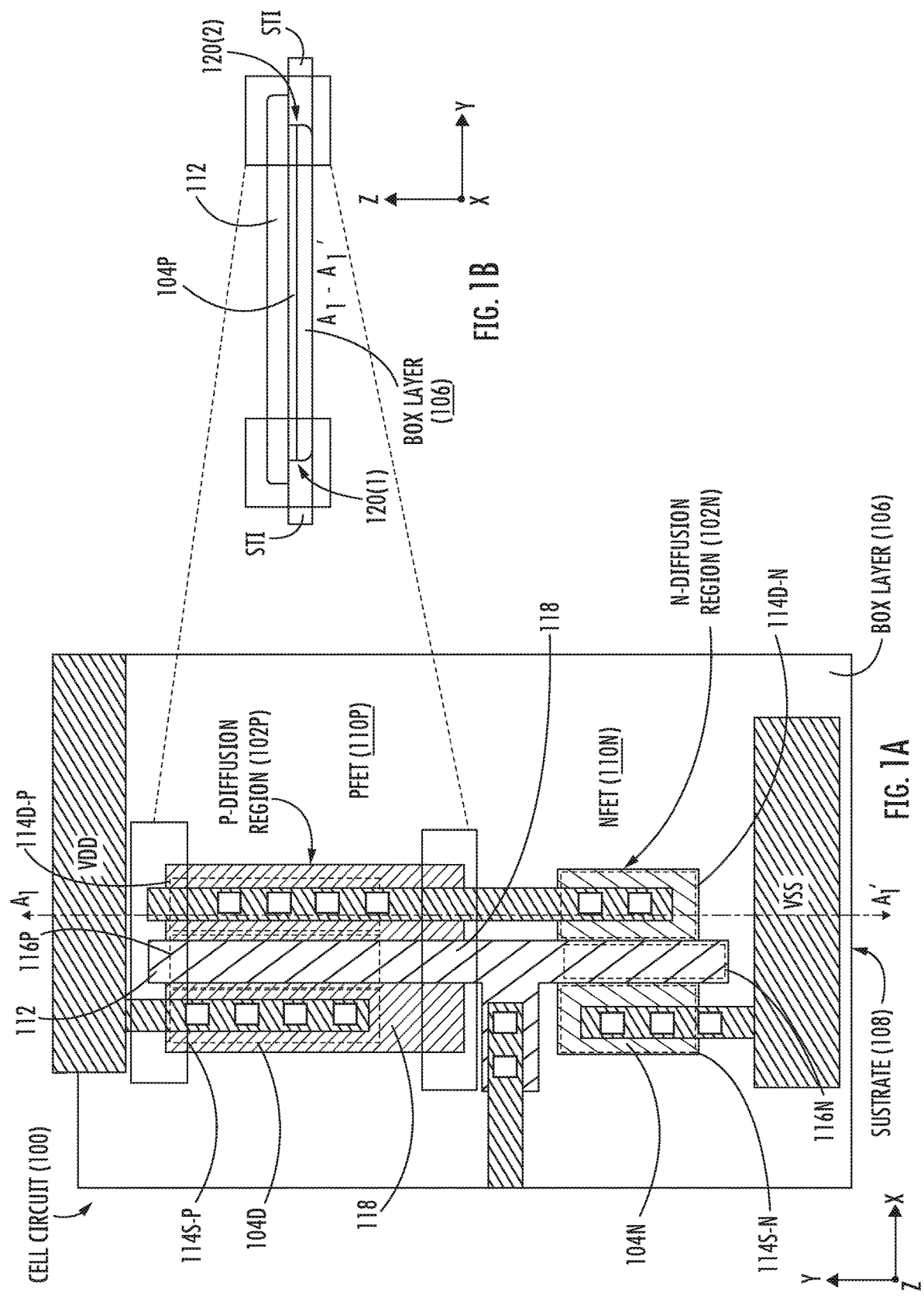
FIGS. 1A and 1B are respective top and side views of an exemplary complementary metal oxide semiconductor (CMOS) cell circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include field-effect transistors (FETs) employing edge transistor current leakage suppression to reduce FET current leakage, and related methods. A FET is provided that includes a conduction channel formed from a semiconductor layer or body (i.e., silicon). The FET may be a silicon-on-insulator (SOI) FET as an example. A source and drain region are formed on opposite sides of the conduction channel in the semiconductor layer by implanting or diffusing doping material in the semiconductor layer. A gate is formed on an insulating layer that is disposed adjacent to the conduction channel to generate an electric field in the conduction channel and control the flow of current in the conduction channel. The conduction channel includes edge conduction channels that are formed at the edges of a gate that overlaps the semiconductor layer, thus effectively forming "edge transistors" in the FET. These gate edges cause the implant or diffusion concentration at the gate edges to be reduced and thus reducing the threshold voltage at the edge transistors, and which reduces the threshold voltage of the FET resulting in increased current leakage.

In this regard, in exemplary aspects disclosed herein, to reduce current leakage of the FET, the FET includes a gate that includes edge gate regions overlapping the semiconductor layer that are extended in length to form extended length edge conduction channels in edge transistors of the FET. In this manner, the threshold voltage of the edge transistors is increased, thus reducing the current leakage of the edge transistors and the overall current leakage of the FET. In additional exemplary aspects disclosed herein, to further reduce current leakage of the FET, a body connection implant that is formed to short the source or drain region to the body of the FET and of an opposite polarity to the source or drain implant, is extended in length to form edge body connection implant regions within at least a portion of the edge gate regions. By forming the edge body connection implant regions, the work function of the edge gate regions is increased in voltage thus increasing the threshold voltage of the edge transistors of the FET. Increasing the threshold voltage of the edge gate regions reduces the current leakage of the edges transistors and the overall current leakage of the FET.

Figure 2:
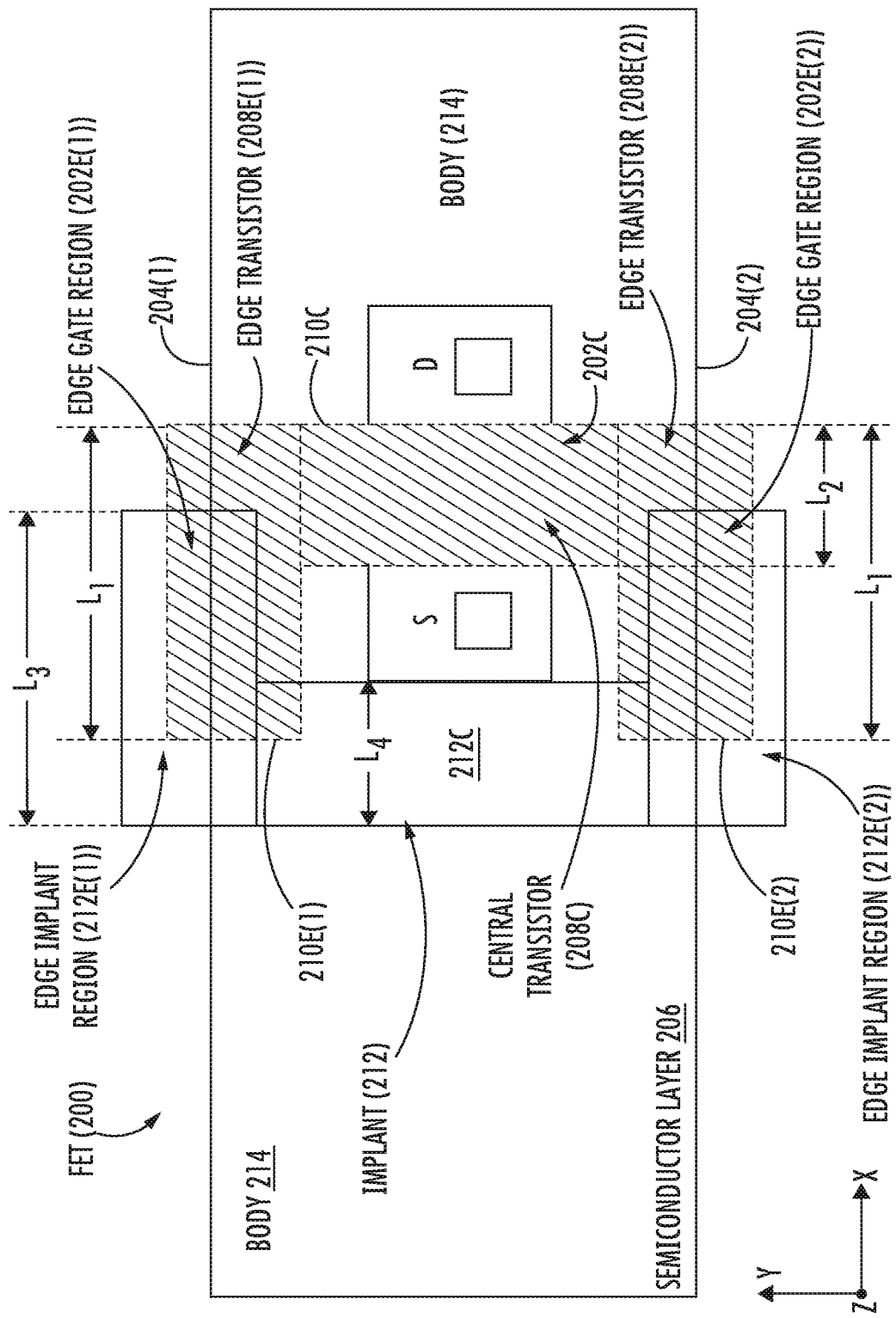
FIG. 2 is a top plan view of an exemplary field-effect transistor (FET) that includes a gate that includes edge gate regions overlapping a semiconductor layer that are extended in length to form extended length edge conduction channels in edge transistors of the FET, and a body connection implant that includes edge body connection implant regions within a least a portion of the edge gate regions to increase the threshold voltage of the edge transistors thus reducing the current leakage of the edges transistors and the overall current leakage of the FET.

In this regard, FIG. 2 is a top plan view of an exemplary FET 200. As discussed in more detail below, the FET 200 includes a gate 202 that includes edge gate regions 202E(1), 202E(2) overlying end regions 204(1), 204(2) of a semiconductor layer 206 of a semiconductor material, such as silicon for example. The gate 202 also includes a central gate region 202C disposed between the edge gate regions 202E(1), 202E(2). A source region S and a drain region D are formed on opposite sides of the central gate region 202C to form the FET 200. The formation of the edge gate regions 202E(1), 202E(2) causes the implant or diffusion concentration at the edge gate regions 202E(1), 202E(2) to be reduced and thus reducing the threshold voltage at edge transistors 208E(1), 208E(2) formed by the edge gate regions 202E(1), 202E(2). This reduces the threshold voltage of the edge transistors 208E(1), 208E(2), thus reducing the threshold voltage of the FET 200. This results in increased current leakage in the FET 200. In this regard, as shown in the example FET 200 in FIG. 2, the edge gate regions 202E(1), 202E(2) are extended to a length $L_1$ from a length $L_2$ of the central gate region 202C of the gate 202 to form extended length edge conduction channels 210E(1), 210E(2) underneath the edge gate regions 202E(1), 202E(2) in the semiconductor layer 206. In this manner, the channel length of the edge conduction channels 210E(1), 210E(2) is extended longer below the respective edge gate regions 202E(1), 202E(2). This increases the threshold voltage of the edge transistors 208E(1), 208E(2) formed in the semiconductor layer 206 over what their threshold voltage would be if the channel length of the edge gate regions 202E(1), 202E(2) were not extended in length. Increasing the threshold voltage of the FET 200 reduces current leakage of the FET 200. The lengths $L_1$ of the edge gate regions 202E(1), 202E(2) of the gate 202 can be selected to cause the threshold voltage of the edge transistors 208E(1), 208E(2) to match or exceed the threshold voltage of a central transistor 208C.

Thus, as shown in FIG. 2, the FET 200 can be modeled as three parallel transistors consisting of the two edge transistors 208E(1), 208E(2) and the central transistor 208C each having their own threshold voltage. If the channel lengths of the edge transistors 208E(1), 208E(2) and the central transistor 208C were the same, the threshold voltage of the edge transistors 208E(1), 208E(2) may be lower than the central transistor 208C because of the reduced implant or diffusion concentration at the edge gate regions 202E(1), 202E(2) of the FET 200. Thus, in this case, the edge conduction channels 210E(1), 210E(2) of the edge transistors 208E(1), 208E(2) would be conducting before the central conduction channel 210C of the central transistor 208O, thus resulting in increased current leakage at the end regions 204(1), 204(2) of the semiconductor layer 206 through the edge conduction channels 210E(1), 210E(2). Increased current leakage can increase standby power consumption of the FET 200 in an undesired manner. This current leakage problem can be even more pronounced if the FET 200 is fabricated as a SOI FET where the semiconductor layer 206 is a thin semiconductor layer formed on a buried oxide (BOX) layer.

With continuing reference to FIG. 2, to further reduce current leakage of the FET 200, an optional implant 212 is provided that includes a central implant region 212C adjacent to the source region S in this example. The implant 212 can control the current leakage of the edge transistors 208E(1), 208E(2) to be lower than the central transistor 208C. The implant 212 is a material that is opposite polarity to the polarity of the source region S in this example. The implant 212 also includes edge implant regions 212E(1), 212E(2) are extended to a length $L_3$ over length $L_4$ of the central implant region 212C of the implant 212 underneath portions of the respective edge gate regions 202E(1), 202E(2) in the semiconductor layer 206. In this example, the polarity of the implant 212 and its edge implant regions 212E(1), 212E(2) is the polarity of the gate 202 which includes the edge gate regions 202E(1), 202E(2). By extending the edge implant regions 212E(1), 212E(2) underlying the respective edge gate regions 202E(1), the work function of the edge gate regions 202E(1), 202E(2) is increased in voltage thus increasing the threshold voltage of the edge transistors 208E(1), 208E(2) of the FET 200. The threshold voltage of a FET including FET 200 is determined by several factors, one of which includes the work function of the gate 202. Again, increasing the threshold voltage of the edge transistors 208E(1), 208E(2) reduces the current leakage of the edge transistors 208E(1), 208E(2) and the overall current leakage of the FET 200. Note that a similar implant can be provided to control the threshold voltage of the edge transistors 208E(1), 208E(2) to cause the current leakage of the edge transistors 208E(1), 208E(2) to be lower than the central transistor 208C.

The amount of doping of the implant 212 may be selected to cause the threshold voltage of the edge transistors 208E(1), 208E(2) to match or exceed the threshold voltage of the central transistor 208C. The edge implant regions 212E(1), 212E(2) may increase the work function of the respective edge gate regions 202E(1), 202E(2) by one of many tenths of a Volt (V), such as 0.5 V as an example. Depending on the threshold voltage of the central transistor 208C, and the level of doping in the edge implant regions 212E(1), 214E(2) of the implant 212, the threshold voltage of the edge transistors 208E(1), 208E(2) may raise to a level that is equal to or above the threshold voltage of the central transistor 208C.

Further if the FET 200 is fabricated as part of a CMOS IC as an example, the doping of the implant 212 may occur during normal doping such that no additional fabrication steps are required. For example, in the FET 200 in FIG. 2, the implant 212 is a body connection implant that shorts the source S to the body 214 of the FET 200 as part of the semiconductor layer 206 that is disposed outside of the gate 202. For example, an IC formed from the FET 200 may be designed to short the source S or the drain to the body 214. Providing a body connection implant like implant 212 with the extended edge implant regions 212E(1), 212E(2) to increase the threshold voltage of the respective edge transistors 208E(1), 202E(2) has the advantage of employing an existing structure in the FET 200 for efficiency of layout. A separate implant does not need to be provided in the FET 200 to increase the threshold voltage of the respective edge transistors 208E(1), 202E(2) with this technique.

Note that to increase the threshold voltage of the edge transistors 208E(1), 208E(2), the FET 200 can be fabricated to include either the implant 212 with the extended edge implant regions 212E(1), 212E(2) underlying at least a portion of the gate 202, or include the gate 202 with extended edge gate regions 202E(1), 202E(2), or both in combination. Including both features may be able to increase the threshold voltage to a desired level that only one feature may not be able to accomplish.

Figure 3:
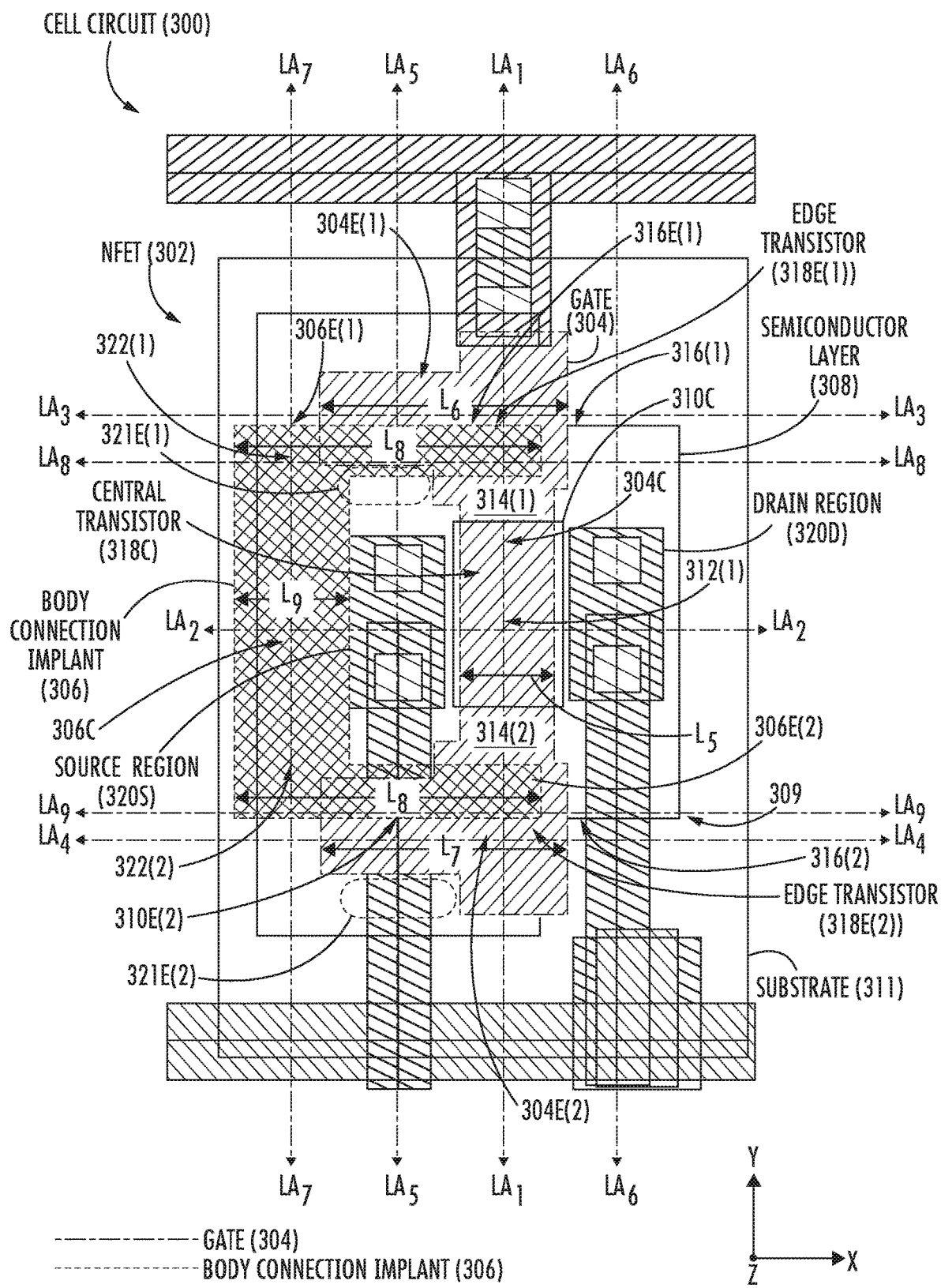
FIG. 3 is a schematic diagram of an exemplary circuit that includes an N-type FET (NFET) that includes a gate that includes edge gate regions and a P-type body connection implant that includes edge body connection implant regions like contained in the FET in FIG. 2 to reduce current leakage of the NFET.

FIG. 3 is a schematic diagram of an exemplary circuit 300, which is realized in a cell layout as a cell circuit in this example, and that includes an NFET 302. As discussed below, the NFET 302 includes a gate 304 that includes edge gate regions 304E(1), 304E(2) similar to the design of the FET 200 in FIG. 2 to reduce current leakage of the NFET 302. Also, the NFET 302 includes a P-type body connection implant 306 that includes edge implant regions 306E(1), 306E(2) similar to the design of the FET 200 in FIG. 2 to also reduce current leakage of the NFET 302. The NFET 302 includes a semiconductor layer 308 comprised of a P-type semiconductor material, such as silicon for example. The semiconductor layer 308 forms conduction channels for the NFET 302. As an example, the NFET 302 may be a SOI NFET 302, wherein the semiconductor layer 308 is a thin layer P-well body disposed on a buried oxide (BOX) layer 309 that is disposed on a substrate 311.

The gate 304 is disposed above the semiconductor layer 308 to form a central conduction channel 310C for the NFET 302. The gate 304 may be made of a polysilicon material as an example. The gate 304 includes a central gate region 304C that is disposed above a first region 312(1) of the semiconductor layer 308. The central gate region 304C forms the central conduction channel 310C in the first region 312(1) of the semiconductor layer 308 for the NFET 302. The central gate region 304C is disposed along a first longitudinal axis $LA_1$ in the Y-axis direction or height direction as shown in FIG. 3. The central gate region 304C has a first end 314(1) and a second end 314(2) opposite the first end 314(1). The central gate region 304C has a length $L_5$ along a second longitudinal axis $LA_2$ in the X-axis or length direction orthogonal to the first longitudinal axis $LA_1$. The gate 304 also includes two edge gate regions 304E(1), 304E(2) that both overlie a respective end region 316(1), 316(2) of the semiconductor layer 308 to form respective edge conduction channels 310E(1), 310E(2) in the respective end regions 316(1), 316(2) of the semiconductor layer 308. The edge gate regions 304E(1), 304E(2) are disposed along respective third and fourth longitudinal axes $LA_3$, $LA_4$ both orthogonal to the first longitudinal axis $LA_1$, and are disposed adjacent to the respective first and second ends 314(1), 314(2) of the central gate region 304C. The edge gate regions 304E(1), 304E(2) have respective lengths $L_6$, $L_7$ longer than the length $L_5$ of the central gate region 304C. This causes the channel length of the edge conduction channels 310E(1), 310E(2) to be extended longer to respective lengths $L_6$, $L_7$ below the respective edge gate regions 304E(1), 304E(2). This increases the threshold voltage of edge transistors 318E(1), 318E(2) formed in the semiconductor layer 308 over what their threshold voltage would be if the channel length of the edge gate regions 304E(1), 304E(2) were not extended in length. Increasing the threshold voltage of the NFET 302 reduces current leakage of the NFET 302.

The lengths $L_6$, $L_7$ of the edge gate regions 304E(1), 304E(2) can be different lengths to provide an asymmetric gate 304 or can be the same lengths to provide a symmetric gate 304. The lengths $L_6$, $L_7$ of either or both of the edge gate regions 304E(1), 304E(2) can be at least 0.1 micrometers (µm) longer than the length $L_5$ of the central gate region 304C. A ratio of the lengths $L_6$, $L_7$ of either or both of the edge gate regions 304E(1), 304E(2) to the length $L_5$ of the central gate region 304C can be at least 1.02.

With continuing reference to FIG. 3, a source region 320S of the NFET 302 is formed of an N-type material with an N+ polarity within the semiconductor layer 308 and disposed on a first side of the central conduction channel 310C along the longitudinal axis $LA_5$ orthogonal to the first longitudinal axis $LA_1$. A drain region 320D of the NFET 302 is also formed of an N-type material with an N+ polarity within the semiconductor layer 308 and disposed on a second side of the central conduction channel 310C opposite the first side along the longitudinal axis $LA_6$ orthogonal to the first longitudinal axis $LA_1$. The central gate region 304C disposed over the first region 312(1) of the semiconductor layer 308 along with the source and drain regions 320S, 320D formed on each side of the central gate region 304C form a central transistor 318C that has a first threshold voltage, which is a function of a work function of the central gate region 304C. The first and second edge transistors 318E(1), 318E(2) are defined by the respective edge gate regions 304E(1), 304E(2) disposed over the semiconductor layer 308. The first and second edge transistors 318E(1), 318E(2) have second and third threshold voltages, which are a function of the work function of their edge gate regions 304E(1), 304E(2).

With continuing reference to FIG. 3, note that the first and second edge gate regions 304E(1), 304E(2) are not a single rectangular shape and include respective void regions 321E(1), 321E(2). The size of the void regions 321E(1), 321E(2) can be designed to achieve the desired tradeoff between conduction of the edge conduction channels 310E(1), 310E(2) and the parasitic gate capacitance caused by the capacitance of the gate 304 to the edge conduction channels 310E(1), 310E(2). The area of the edge gate regions 304E(1), 304E(2) affects the overall area of the gate 304 and thus the overall parasitic gate capacitance. The size of the void regions 321E(1), 321E(2) can be designed to control the area of the edge gate regions 304E(1), 304E(2) and thus control the overall area of the gate 304 to control gate capacitance. Increased gate capacitance can limit switching speed of the NFET 302.

With continuing reference to FIG. 3, the NFET 302 also includes the body connection implant 306, which is a material implant in this example. The body connection implant 306 includes a central implant region 306C that is disposed along a longitudinal axis $LA_7$ that is orthogonal to the longitudinal axis $LA_2$. The central implant region 306C has a first end 322(1) and a second end 322(2) disposed opposite of the first end 322(1) both along the longitudinal axis $LA_5$. The body connection implant 306 also includes first and second edge implant regions 306E(1), 306E(2) that are each disposed below or underlie at least a portion of the respective first and second edge gate regions 304E(1), 304(2). The first and second edge implant regions 306E(1), 306E(2) are disposed along longitudinal axes $LA_8$, $LA_9$ parallel to the longitudinal axis $LA_2$. The body connection implant 306 and its central implant region 306C and its first and second edge implant regions 306E(1), 306E(2) are electrically coupled the source region 320S and the body/semiconductor layer 308 in this example to short the two together.

The edge implant regions 306E(1), 306E(2) each have a length $L_8$ longer than a length $L_9$ of the central implant region 306C so that edge implant regions 306E(1), 306E(2) extend below the respective first and second edge gate regions 304E(1), 304(2) to change their respective work functions. By extending the edge implant regions 306E(1), 306E(2) underlying the respective first and second edge gate regions 304E(1), 304E(2), the work function of the edge gate regions 304E(1), 304E(2) is increased in voltage thus increasing the threshold voltage of the edge transistors 318E(1), 318E(2) of the NFET 302. Again, increasing the threshold voltage of the edge transistors 318E(1), 318E(2) reduces the current leakage of the edge transistors 318E(1), 318E(2) and thus the overall current leakage of the NFET 302.

In this example, the edge implant regions 306E(1), 306E(2) are provided such that the work functions of the first and second edge gate regions 304E(1), 304E(2) are greater than or equal to the work function of the central gate region 304C. However, this is not required. The amount of doping of the edge implant regions 306E(1), 306E(2) of the body connection implant 306 may be selected to cause the threshold voltage of the first and second edge transistors 318E(1), 318E(2) to match or exceed the threshold voltage of the central transistor 318C. The edge implant regions 306E(1), 306E(2) may increase the work function of the respective edge gate regions 304E(1), 304E(2) by one of many tenths of a Volt (V), such as 0.5 V as an example. Depending on the threshold voltage of the central transistor 318C, and the level of doping in the edge implant regions 306E(1), 306E(2) of the body connection implant 306, the threshold voltage of the edge transistors 318E(1), 318E(2) may raise to a level that is equal to or above the threshold voltage of the central transistor 318C.

Also note that the lengths $L_8$ of the edge implant regions 306E(1), 306E(2) could be the same or different depending on design preferences. The length $L_9$ of the central implant region 306C is selected so as to not interfere with and to leave area for the formation of the source region 320S in this example. Note that in other examples, the body connection implant 306 could be formed to short the drain region 320D to the body/semiconductor layer 308.

Providing the edge gate regions 304E(1), 304E(2) and/or the edge implant regions 306E(1), 306E(2) in the NFET 302 controls the threshold voltages of the edge transistors 318E(1), 318E(2) as discussed above. For example, these features can be provided such that the threshold voltages of the edge transistors 318E(1), 318E(2) are equal to or greater than the threshold voltage of the central transistor 318C in the NFET 302. These features can also be provided such that either or both threshold voltages of the edge transistors 318E(1), 318E(2) are at least 300 millivolts (mV) higher than the threshold voltage of the central transistor 318C. As an example, the threshold voltages of the edge transistors 318E(1), 318E(2) could be one (1) V higher than the threshold voltage of the central transistor 318C. These features can also be provided such that a ratio of either or both threshold voltages of the edge transistors 318E(1), 318E(2) to the threshold voltage of the central transistor 318C is at least 1.5 (e.g., at least 1.6) in the NFET 302. The edge implant regions 306E(1), 306E(2) in the NFET 302 can be designed such that the work function of the edge transistors 318E(1), 318E(2) are equal to or greater than the work function of the central transistor 318C. These features can be provided to control the leakage current of the edge transistors 318E(1), 318E(2) as compared to the central transistor 318C in the NFET 302. For example, a ratio of current leakage of one or both of the edge transistor 318E(1), 318E(2) to the current leakage of the central transistor 318C may be at least 5.0. As another example, the ratio of current leakage of one or both of the edge transistor 318E(1), 318E(2) to the current leakage of the central transistor 318C may be between 5.0 and 10.0.

Figure 4A:
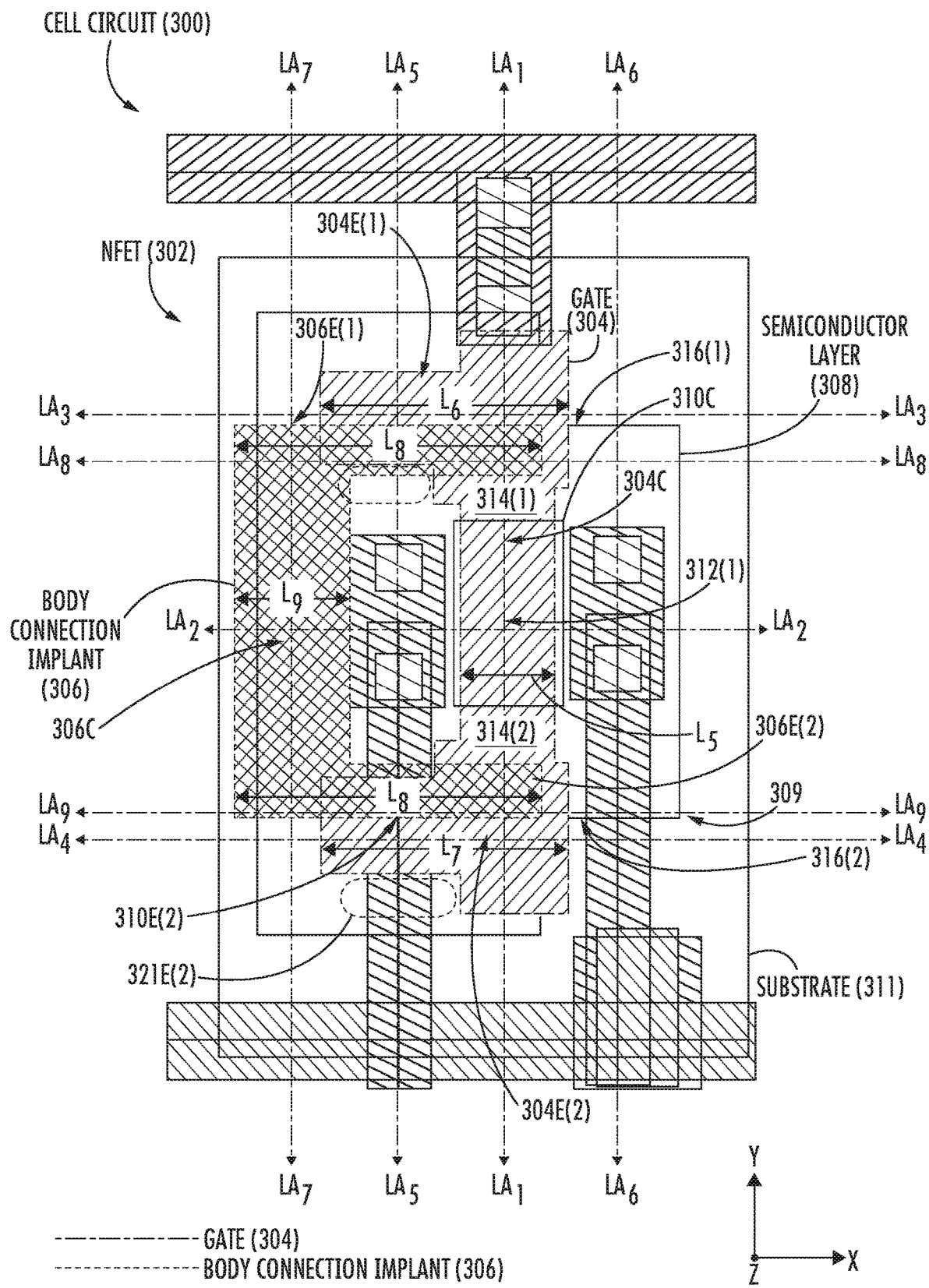
FIGS. 4A and 4B are top and cross-sectional side views of the exemplary circuit and NFET in FIG. 3.
Figure 4B:
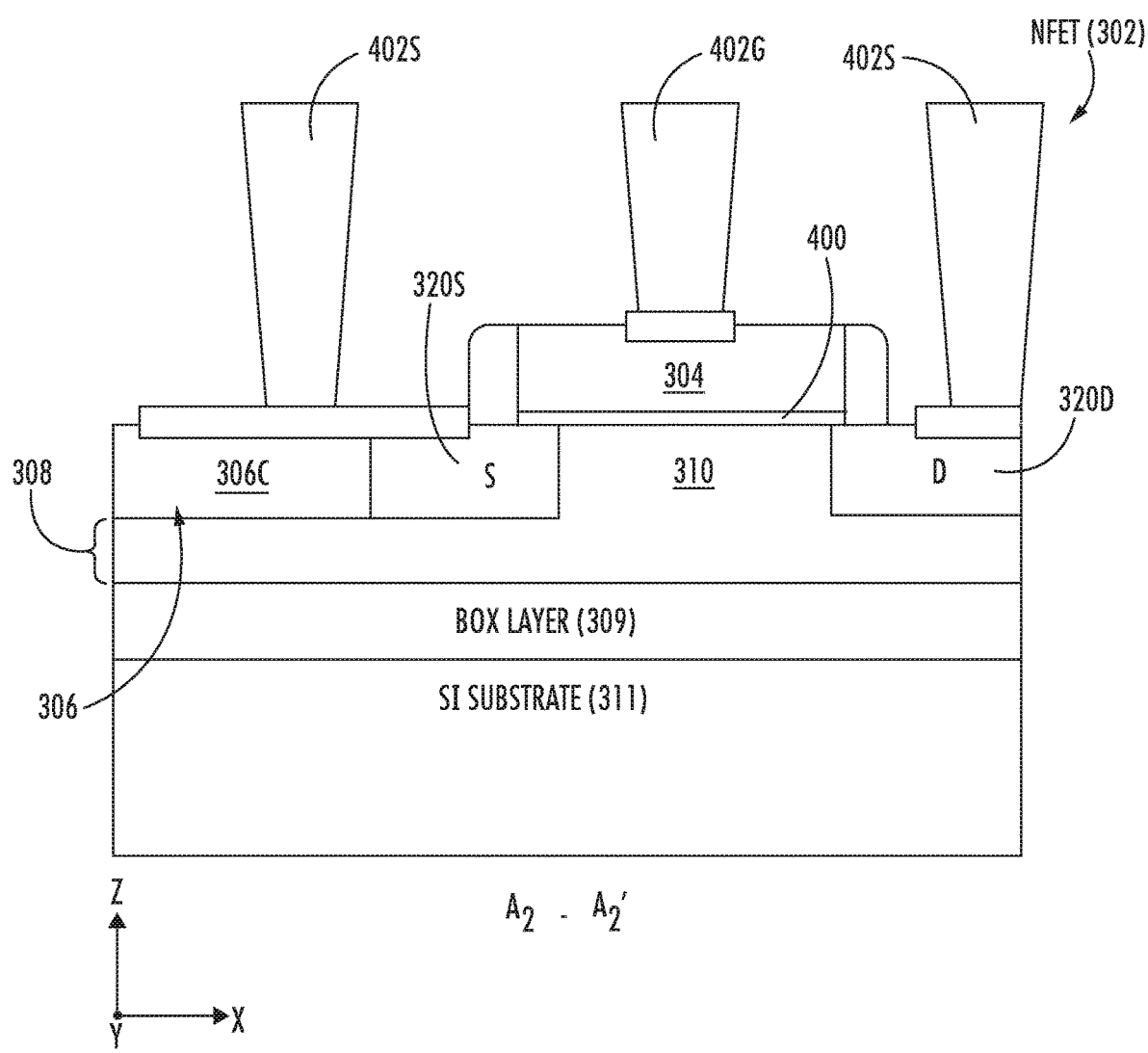

FIGS. 4A and 4B are top and cross-sectional side views of the exemplary circuit 300 and NFET 302 in FIG. 3 to illustrate more detail. FIG. 4A is a top view of the circuit 300 like provided in FIG. 3. FIG. 4B is a cross-section side view of the circuit 300 in FIG. 4A along the $A_2$-$A_2'$ line. As shown in FIG. 4B, in this example, the NFET 302 is a SOI NFET. The BOX layer 309 is disposed above and on the substrate 311. The semiconductor layer 308 is disposed on the BOX layer 309. The source and drain regions 320S, 320D are implanted in the semiconductor layer 308. The P-type central conduction channel 310C of the NFET 302 is formed underneath the gate 304 that is disposed on an insulator 400 between the P+ gate 304 and the central conduction channel 310C. An N-type source contact 402S, an N-type drain contact 402D, and a gate contact 402G are provided in contact with the respective source region 320S, drain region 320D, and gate 304. The P-type body connection implant 306 shown in the central implant region 306C is disposed adjacent to the source region 320S.

Figure 5:
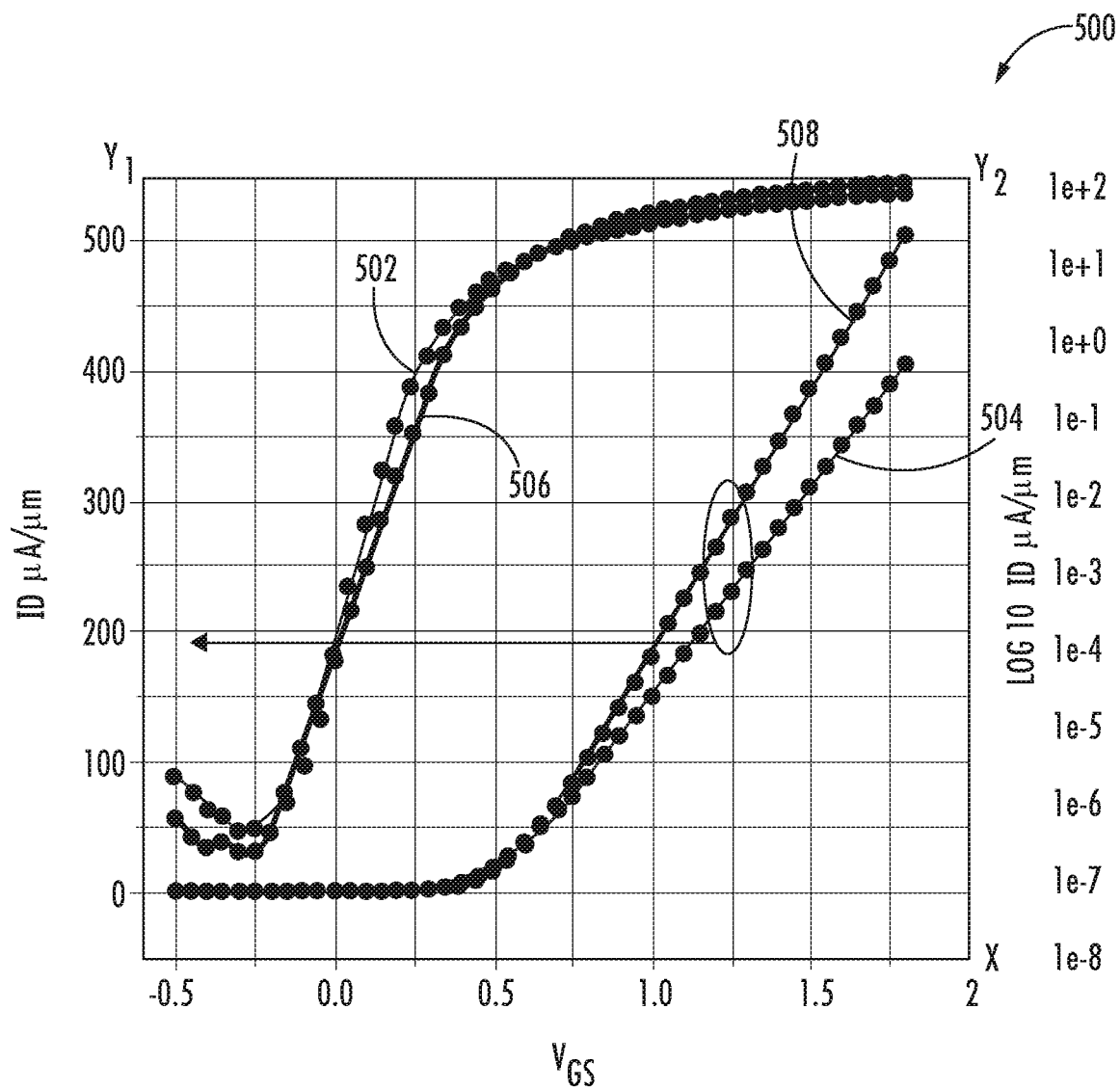
FIG. 5 is a graph illustrating an exemplary relationship between the gate-to-source voltage ($V_{GS}$) of the NFET in the circuit in FIG. 3 and leakage current of the NFET.

FIG. 5 is a graph 500 illustrating an exemplary relationship between the gate-to-source voltage ($V_{GS}$) of the NFET 302 in the circuit 300 in FIG. 3 and leakage current of the NFET 302. The X-axis (X) is the gate-to-source voltage ($V_{GS}$) of the NFET 302. A first Y-axis $Y_1$ is the channel current Id in the central conduction channel 310C of the NFET 302 in microAmps (μA) per micrometer (μm) for a given $V_{GS}$ of the NFET 302. A second Y-axis $Y_2$ is a logarithmic base 10 ($\log_{10}$) channel current Id in the central conduction channel 310C of the NFET 302 in μA/μm for a given $V_{GS}$ of the NFET 302. A first curve 502 illustrates the channel current Id in the central conduction channel 310C for a given $V_{GS}$ of an NFET that does not include the features in the NFET 302 to increase the threshold voltage. The saturation of channel current Id in curve 502 is approximately 0.8 V. A second curve 504 illustrates the channel current Id in the central conduction channel 310C in a $\log_{10}$ scale for a given $V_{GS}$ of an NFET that does not include the features in the NFET 302 to increase the threshold voltage. The saturation of channel current Id in curve 502 is approximately 0.8 V. A third curve 506 illustrates the channel current Id in the central conduction channel 310C for a given $V_{GS}$ of the NFET 302 that has an increased threshold voltage. A fourth curve 508 illustrates the channel current Id in the central conduction channel 310C in a $\log_{10}$ scale for a given $V_{GS}$ of the NFET 302 that has an increased threshold voltage.

Thus, as shown in curves 504 and 508 FIG. 5, the features described in the NFET 302 in FIGS. 3-4B allow an approximately 25% higher drive current (i.e., 200 μA vs. 150 μA at the threshold voltage of 1.0 V and thus at same leakage current as an NWT that does not include the higher threshold voltage for the same channel length. Or, the channel length of the NFET 302 in FIGS. 3-4B can be reduced to provide a 5× to 6× lower leakage current than an NFET that does not include the higher threshold voltage at the same drive current.

Figure 6:
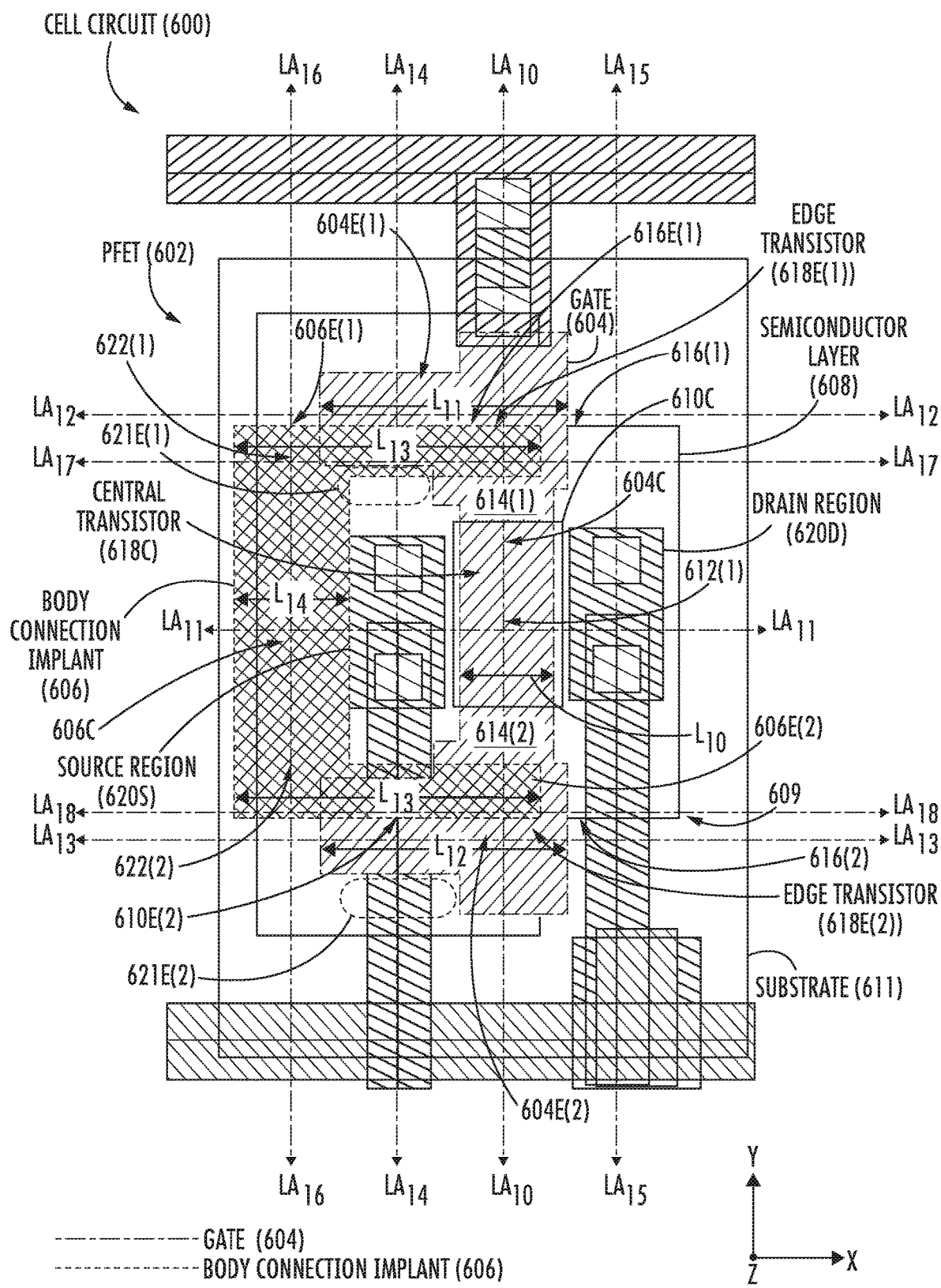
FIG. 6 is a schematic diagram of an exemplary circuit that includes a P-type FET (PFET) that includes a gate that includes edge gate regions and an N-type body connection implant that includes edge body connection implant regions like contained in the FET in FIG. 2 to reduce current leakage of the PFET.

FIG. 6 is a schematic diagram of an exemplary circuit 600, which is realized in a cell layout as a cell circuit in this example. The circuit 600 includes a PFET 602 that includes similar features to the NFET 302 in FIG. 3 to increase the threshold voltage of the PFET 602 and reduces its leakage current as a result. The PFET 602 includes a gate 604 that includes edge gate regions 604E(1), 604E(2) similar to the design of the NFET 302 in FIG. 3 to reduce current leakage of the PFET 602. Also, the PFET 602 includes an N-type body connection implant 606 that includes edge implant regions 606E(1), 606E(2). The PFET 602 includes a semiconductor layer 608 comprised of an N-type semiconductor material, such as silicon for example. The semiconductor layer 608 forms conduction channels for the PFET 602. As an example, the PFET 602 may be a SOI PFET 602, wherein the semiconductor layer 608 is a thin layer P-well body disposed on a BOX layer 609 that is disposed on a substrate 611.

The gate 604 is disposed above the semiconductor layer 608 to form a central conduction channel 610C for the PFET 602. The gate 604 may be made of a polysilicon material as an example. The gate 604 includes a central gate region 604C that is disposed above a first region 612(1) of the semiconductor layer 608. The central gate region 604C forms the central conduction channel 610C in the first region 612(1) of the semiconductor layer 608 for the PFET 602. The central gate region 604C is disposed along a longitudinal axis $LA_{10}$ in the Y-axis direction or height direction as shown in FIG. 6. The central gate region 604C has a first end 614(1) and a second end 614(2) opposite the first end 614(1). The central gate region 604C has a length $L_{10}$ along a longitudinal axis $LA_{11}$ in the X-axis or length direction orthogonal to the longitudinal axis $LA_{10}$. The gate 604 also includes two edge gate regions 604E(1), 604E(2) that both overlie a respective end region 616(1), 616(2) of the semiconductor layer 608 to form respective edge conduction channels 610E(1), 610E(2) in the respective end regions 616(1), 616(2) of the semiconductor layer 608. The edge gate regions 604E(1), 604E(2) are disposed along respective longitudinal axes $LA_{12}$, $L_{13}$ both orthogonal to the longitudinal axis $LA_{10}$, and are disposed adjacent to the respective first and second ends 614(1), 614(2) of the central gate region 604C. The edge gate regions 604E(1), 604E(2) have respective lengths $L_{11}$, $L_{12}$ longer than the length $L_{10}$ of the central gate region 604C. This causes the channel length of the edge conduction channels 610E(1), 610E(2) to be extended longer to respective lengths $L_{11}$, $L_{12}$ below the respective edge gate regions 604E(1), 604E(2). This increases the threshold voltage of edge transistors 618E(1), 618E(2) formed in the semiconductor layer 608 over what their threshold voltage would be if the channel length of the edge gate regions 604E(1), 604E(2) were not extended in length. Increasing the threshold voltage of the PFET 602 reduces current leakage of the PFET 602.

The lengths $L_{11}$, $L_{12}$ of the edge gate regions 604E(1), 604E(2) can be different lengths to provide an asymmetric gate 604 or can be the same lengths to provide a symmetric gate 604. The lengths $L_{11}$, $L_{12}$ of either or both of the edge gate regions 604E(1), 604E(2) can be at least 0.1 μm longer than the length $L_{10}$ of the central gate region 604C. A ratio of the lengths $L_{11}$, $L_{12}$ of either or both of the edge gate regions 604E(1), 604E(2) to the length $L_{10}$ of the central gate region 604C can be at least 1.02.

With continuing reference to FIG. 6, a source region 620S of the PFET 602 is formed of an P-type material with a P+ polarity within the semiconductor layer 608 and disposed on a first side of the central conduction channel 610C along a longitudinal axis $LA_{14}$ orthogonal to the longitudinal axis $LA_{11}$. A drain region 620D of the PFET 602 is also formed of a P-type material with a P+ polarity within the semiconductor layer 608 and disposed on a second side of the central conduction channel 610C opposite the first side along a longitudinal axis $LA_{15}$ orthogonal to the longitudinal axis $LA_{11}$. The central gate region 604C disposed over the first region 612(1) of the semiconductor layer 608 along with the source and drain regions 620S, 620D formed on each side of the central gate region 604C form a central transistor 618C that has a first threshold voltage, which is a function of a work function of the central gate region 604C. The first and second edge transistors 618E(1), 618E(2) are defined by the respective edge gate regions 604E(1), 604E(2) disposed over the semiconductor layer 608. The first and second edge transistors 618E(1), 618E(2) have second and third threshold voltages, which are a function of the work function of their edge gate regions 604E(1), 604E(2).

With continuing reference to FIG. 6, note that the first and second edge gate regions 604E(1), 604E(2) are not a single rectangular shape and include respective void regions 621E(1), 621E(2). The size of the void regions 621E(1), 621E(2) can be designed to achieve the desired tradeoff between conduction of the edge conduction channels 610E(1), 610E(2) and the parasitic gate capacitance caused by the capacitance of the gate 604 to the edge conduction channels 610E(1), 610E(2). The area of the edge gate regions 604E(1), 604E(2) affects the overall area of the gate 604 and thus the overall parasitic gate capacitance. The size of the void regions 621E(1), 621E(2) can be designed to control the area of the edge gate regions 604E(1), 604E(2) and thus control the overall area of the gate 604 to control gate capacitance. Increased gate capacitance can limit switching speed of the PFET 602.

With continuing reference to FIG. 6, the PFET 602 also includes the body connection implant 606, which is an N+ material implant in this example. The body connection implant 606 includes a central implant region 606C that is disposed along a longitudinal axis $LA_{16}$ that is orthogonal to the longitudinal axis $LA_{11}$. The central implant region 606C has first end 622(1) and a second end 622(2) disposed opposite of the first end 622(1) both along the longitudinal axis $LA_{17}$. The body connection implant 606 also includes first and second edge implant regions 606E(1), 606E(2) that are each disposed below or underlie at least a portion of the respective first and second edge gate regions 604E(1), 604(2). The first and second edge implant regions 606E(1), 606E(2) are disposed along longitudinal axes $LA_{17}$, $LA_{18}$ parallel to the longitudinal axis $LA_{11}$. The body connection implant 606 and its central implant region 606C and its first and second edge implant regions 606E(1), 606E(2) are electrically coupled to the source region 620S and the body/semiconductor layer 608 in this example to short the two together.

The edge implant regions 606E(1), 606E(2) each have a length $L_{13}$ longer than a length $L_{14}$ of the central implant region 606C so that the edge implant regions 606E(1), 606E(2) extend below the respective first and second edge gate regions 604E(1), 604(2) to change their respective work functions. By extending the edge implant regions 606E(1), 606E(2) underlying the respective first and second edge gate regions 604E(1), 604E(2), the work function of the edge gate regions 604E(1), 604E(2) is increased in voltage thus increasing the threshold voltage of the edge transistors 618E(1), 618E(2) of the PFET 602. Again, increasing the threshold voltage of the edge transistors 618E(1), 618E(2) reduces the current leakage of the edge transistors 618E(1), 618E(2) and thus the overall current leakage of the PFET 602.

In this example, the edge implant regions 606E(1), 606E(2) are provided such that the work functions of the first and second edge gate regions 604E(1), 604E(2) are greater than or equal to the work function of the central gate region 604C. However, this is not required. The amount of doping of the edge implant regions 606E(1), 606E(2) of the body connection implant 606 may be selected to cause the threshold voltage of the first and second edge transistors 618E(1), 618E(2) to match or exceed the threshold voltage of the central transistor 618C. The edge implant regions 606E(1), 606E(2) may increase the work function of the respective edge gate regions 604E(1), 604E(2) by one of many tenths of a Volt (V), such as 0.5 V as an example. Depending on the threshold voltage of the central transistor 618C, and the level of doping in the edge implant regions 606E(1), 606E(2) of the body connection implant 606, the threshold voltage of the edge transistors 618E(1), 618E(2) may raise to a level that is equal to or above the threshold voltage of the central transistor 618C.

Also note that the lengths $L_{13}$ of the edge implant regions 606E(1), 606E(2) could be the same or different depending on design preferences. The length $L_{14}$ of the central implant region 606C is selected so as to not interfere with and to leave area for the formation of the source region 620S in this example. Note that in other examples, the body connection implant 606 could be formed to short the drain region 620D to the body/semiconductor layer 608.

Providing the edge gate regions 604E(1), 604E(2) and/or the edge implant regions 606E(1), 606E(2) in the PFET 602 controls the threshold voltages of the edge transistors 618E(1), 618E(2) as discussed above. For example, these features can be provided such that the threshold voltages of the edge transistors 618E(1), 618E(2) are equal to or greater than the threshold voltage of the central transistor 618C in the PFET 602. These features can also be provided such that either or both threshold voltages of the edge transistors 618E(1), 618E(2) are at least 300 mV higher than the threshold voltage of the central transistor 618C. These features can also be provided such that a ratio of either or both threshold voltages of the edge transistors 618E(1), 618E(2) to the threshold voltage of the central transistor 618C is at least 1.6 in the PFET 602. The edge implant regions 606E(1), 606E(2) in the PFET 602 can be designed such that the work function of the edge transistors 618E(1), 618E(2) are equal to or greater than the work function of the central transistor 618C. These feature can be provided to control the leakage current of the edge transistors 618E(1), 618E(2) as compared to the central transistor 618C in the PFET 602. For example, a ratio of current leakage of one or both of the edge transistor 618E(1), 618E(2) to the current leakage of the central transistor 618C may be at least 5.0.

Figure 7:
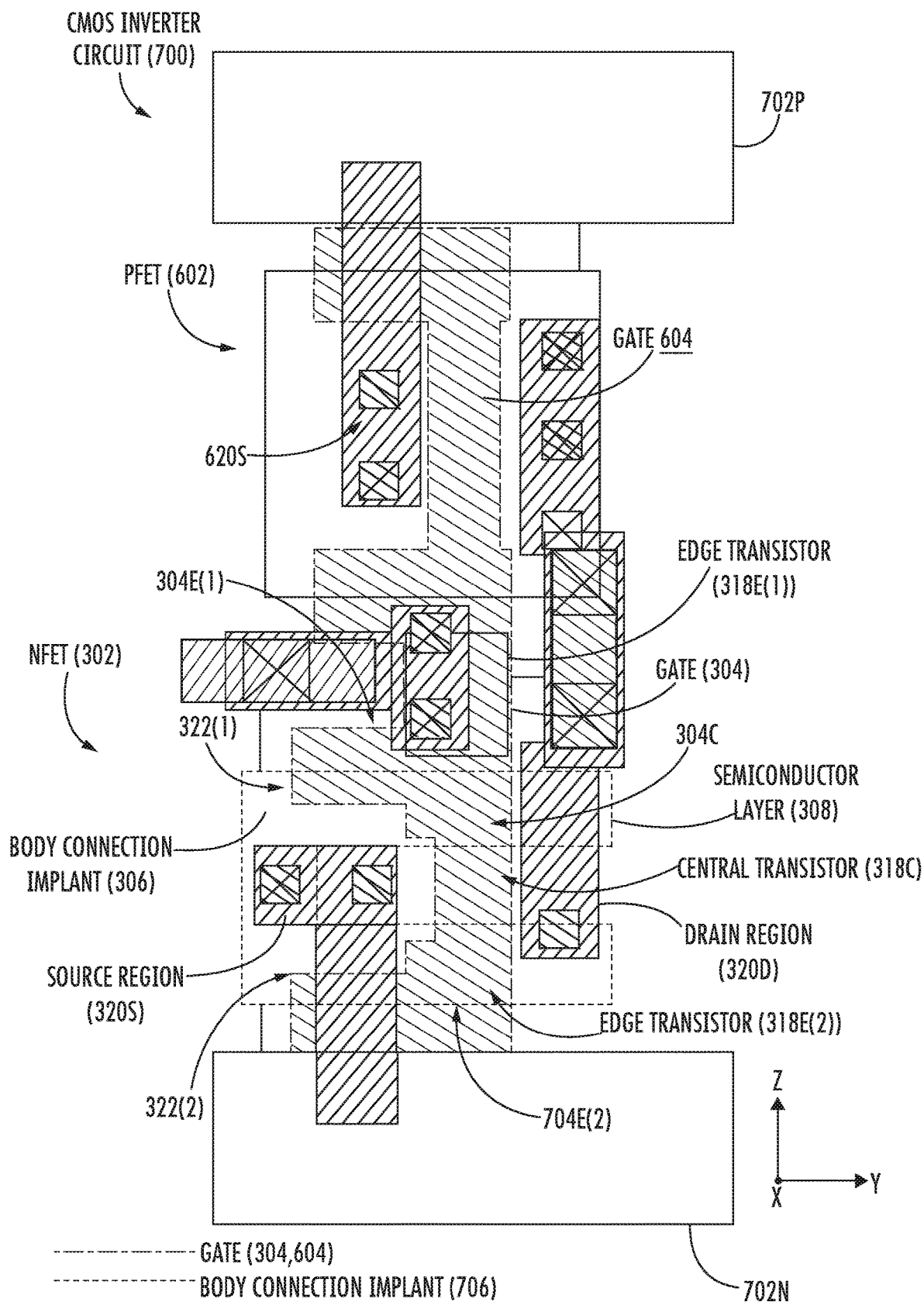
FIG. 7 is a schematic diagram of an exemplary inverter circuit that includes a PFET and NFET that each include a gate that includes edge gate regions and a body connection implant that includes edge body connection implant regions like contained in the FET in FIG. 2 to reduce current leakage of the inverter circuit.

FIG. 7 is a schematic diagram of an exemplary CMOS inverter circuit 700 that includes the NFET 302 and/or the PFET 602 in FIGS. 3 and 6, respectively, and that can include a gate that includes edge gate regions and a body connection implant that includes edge body connection implant regions to reduce current leakage of the inverter circuit. In this example, the NFET 302 in the CMOS inverter circuit 700 is the NFET 302 in FIG. 3. Common elements are shown with common element numbers for the NFET 302 between FIG. 3 and FIG. 7 and will not be re-described. The PFET 602 and the NFET 302 are gate connected through their respective gates 304, 604. The source regions 320S, 620S of the respective NFET 302 and PFET 602 are connected to respective power rails 702N, 702P. For example, power rail 702N may be configured to be connected to a positive voltage source to provide power to the CMOS inverter circuit 700. The power rail 702N may be configured to be coupled to a negative power source or serve as a ground node for the CMOS inverter circuit 700.

Figure 8A:
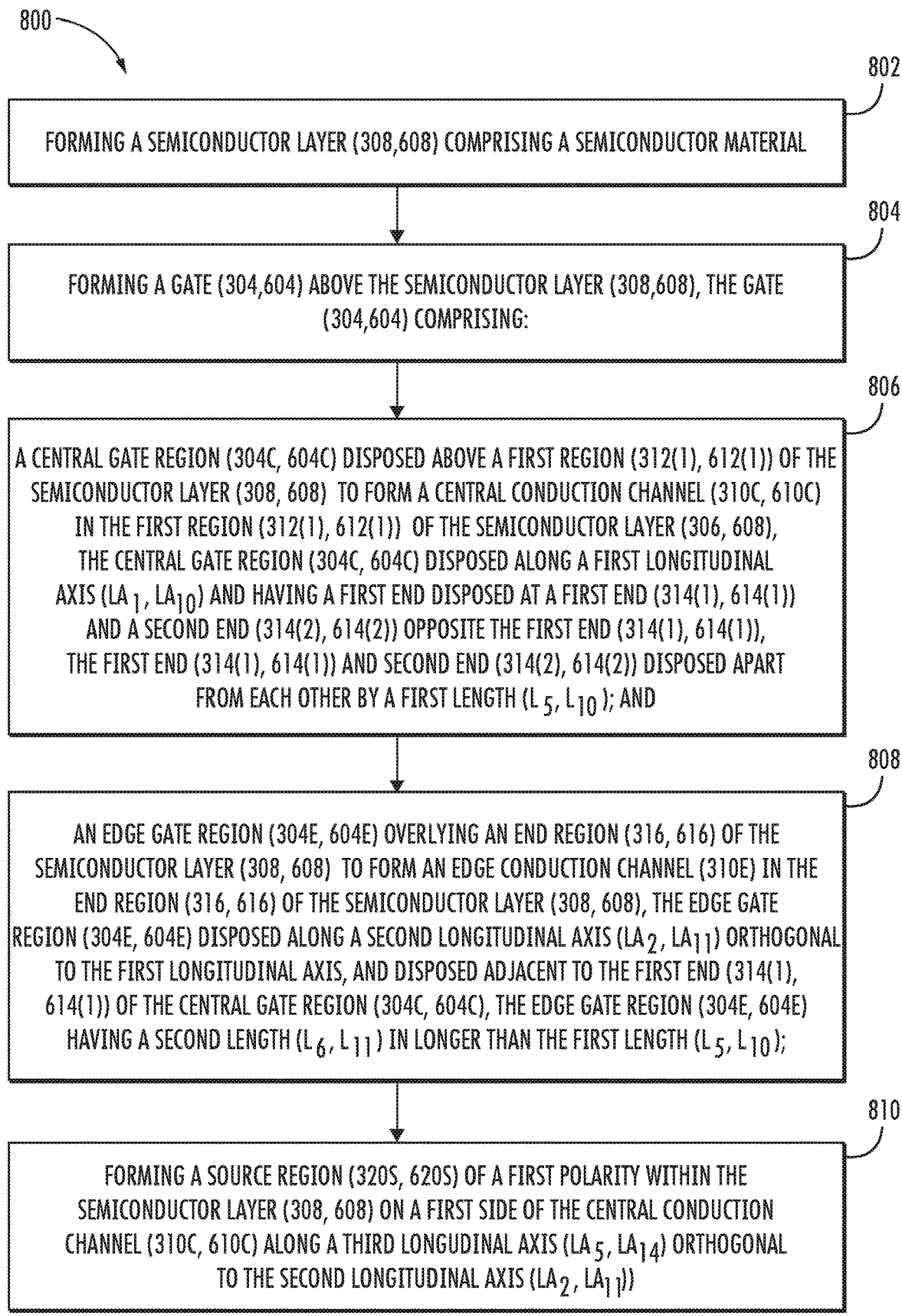
FIGS. 8A and 8B are a flowchart illustrating an exemplary process of fabricating a FET that includes a gate that includes edge gate regions and a body connection implant that includes edge body connection implant regions like contained in the FET in FIG. 2.
Figure 8B:
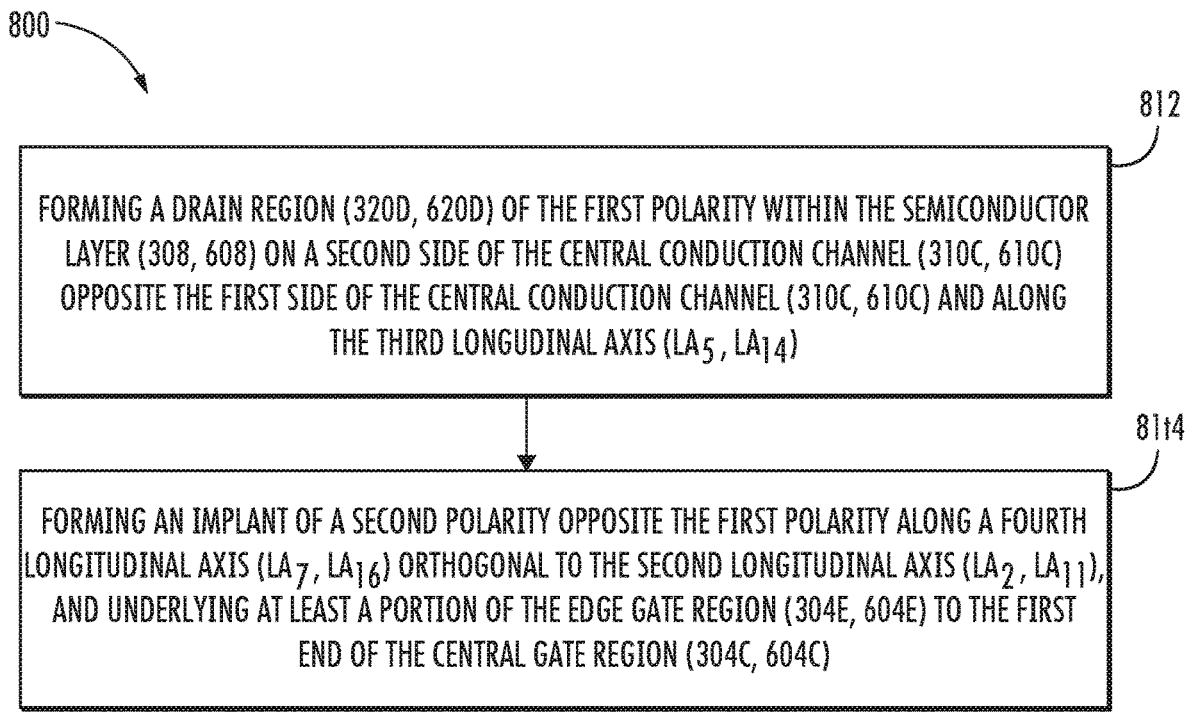

FIGS. 8A and 8B are a flowchart illustrating an exemplary process 800 of fabricating a FET, like the NFET 302 in FIG. 3 and the PFET 602 in FIG. 6, that includes a gate that includes edge gate regions and a body connection implant that includes edge body connection implant regions to reduce threshold voltage of the FET. The process 800 will be discussed in conjunction with the NFET 302 in FIG. 3 and the PFET 602 in FIG. 6. In this regard, as illustrated in FIGS. 8A and 8B, the process 800 includes forming a semiconductor layer 308, 608 comprising a semiconductor material (block 802 in FIG. 8A). The process 800 also includes forming a gate 304, 604 above the semiconductor layer 308, 608 (block 804 in FIG. 8A). The gate 304, 604 comprises a central gate region 304C, 604C disposed above a first region 312(1), 612(1) of the semiconductor layer 308, 608 to form a central conduction channel 310C, 610C in the first region 312(1), 612(1) of the semiconductor layer 308, 608, the central gate region 304C, 604C disposed along a first longitudinal axis $LA_1$, $LA_{10}$ and having a first end disposed at a first end 314(1), 614(1) and a second end 314(2), 614(2) opposite the first end 314(1), 614(1), the first end 314(1), 614(1) and second end 314(2), 614(2) disposed apart from each other by a first length $L_5$, $L_{10}$ (block 806 in FIG. 8A). The gate 304, 604 also comprises an edge gate region 304E, 604E overlying an end region 316, 616 of the semiconductor layer 308, 608 to form an edge conduction channel 310E in the end region 316, 616 of the semiconductor layer 308, 608, the edge gate region 304E, 604E disposed along a second longitudinal axis $LA_2$, $LA_{11}$ orthogonal to the first longitudinal axis, and disposed adjacent to the first end 314(1), 614(1) of the central gate region 304C, 604C, the edge gate region 304E, 604E having a second length $L_{11}$ longer than the first length $L_5$, $L_{10}$ (block 808 in FIG. 8A).

A next step in the process 800 can include forming a source region (320S, 620S) of a first polarity within the semiconductor layer 308, 608 on a first side of the central conduction channel 310C, 610C along a third longitudinal axis $LA_3$, $LA_{12}$ orthogonal to the first longitudinal axis $LA_1$, $LA_{10}$ (block 810 in FIG. 8A). A next step in the process 800 can include forming a drain region 320D, 620D of the first polarity within the semiconductor layer 308, 608 on a second side of the central conduction channel 310C, 610C opposite the first side of the central conduction channel 310C, 610C and along the longitudinal axis $LA_4$, $LA_9$ (block 812 in FIG. 8B). A next step in the process 800 can include forming an implant of a second polarity opposite the first polarity along a fourth longitudinal axis $LA_7$, $LA_{16}$ orthogonal to the second longitudinal axis $LA_2$, $LA_{11}$, and underlying at least a portion of the edge gate region 304E, 604E to the first end of the central gate region 304C, 604C (block 814 in FIG. 8B).

Figure 9:
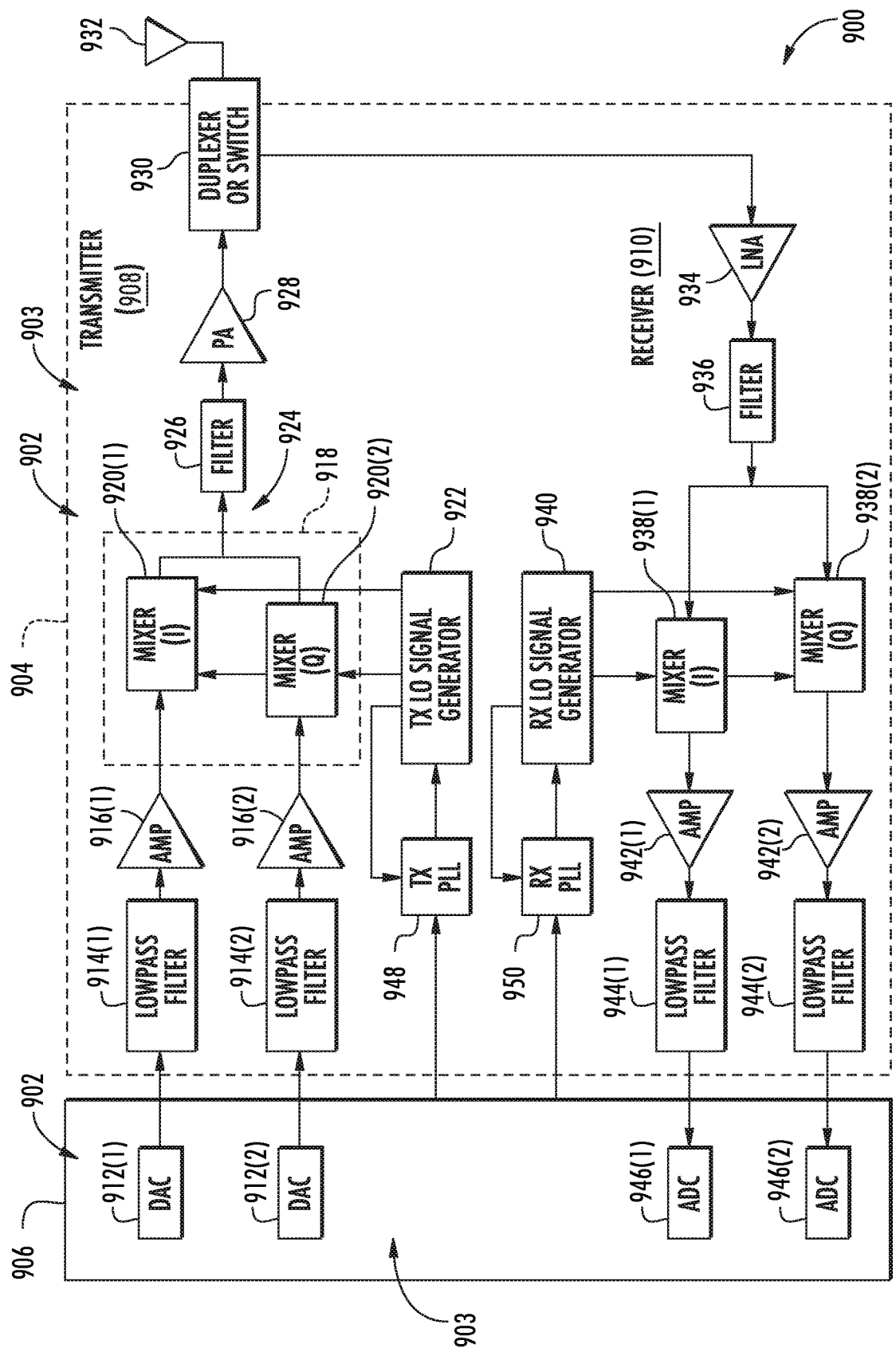
FIG. 9 is a block diagram of an exemplary wireless communications device that include radio frequency (RF) components that can include one or more FETs.

FIG. 9 illustrates an exemplary wireless communications device 900 that includes radio frequency (RF) components formed from one or more ICs 902, wherein any of the ICs 902 can include FETs 903 that each include a gate that includes edge gate regions and a body connection implant that includes edge body connection implant region, including, but not limited to, the FETs in FIGS. 2-4B and 6-7 and circuits in FIGS. 3-4B and 6-7, and according to any of the aspects disclosed herein. The wireless communications device 900 may include or be provided in any of the above referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RFICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906, In this example, the data processor 906 includes ADCs 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

FETs that each include a gate that includes edge gate regions and a body connection implant that includes edge body connection implant region, including, but not limited to, the FETs in FIGS. 2-4B and 6-7 and circuits in FIGS. 3-4B and 6-7, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
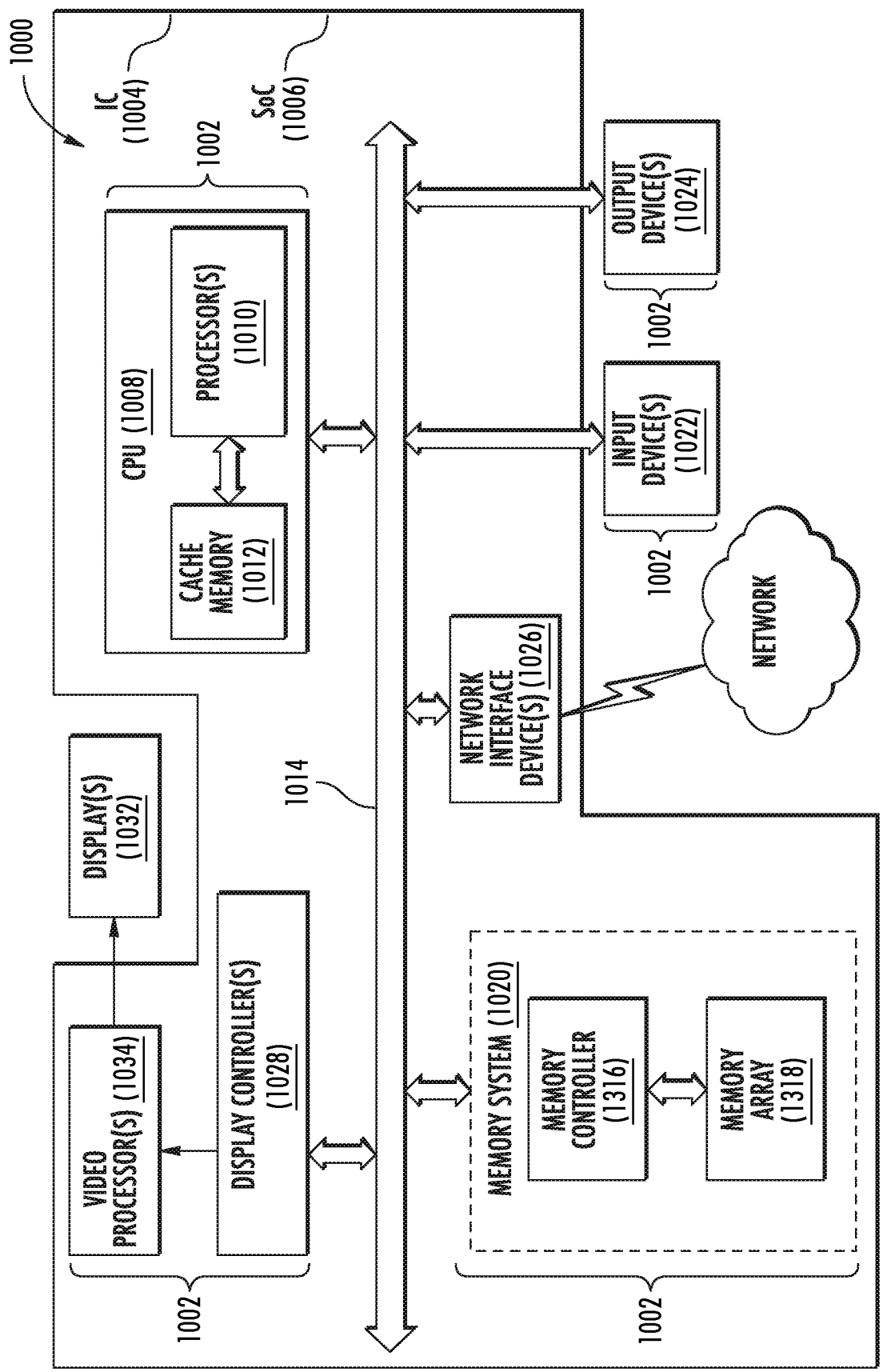
FIG. 10 is a block diagram of an exemplary processor-based system that includes one or more FETs that each include a gate that includes edge gate regions and a body connection implant that each include a gate that includes edge gate regions and a body connection implant that includes edge body connection implant regions, including, but not limited to, the FETs in FIGS. 2-4B and 6-7 and circuits in FIGS. 3-4B and 6-7, and according to any of the aspects disclosed herein.

In this regard, FIG. 10 illustrates an example of a processor-based system 1000 that includes circuits that can include FETs that each include a gate that includes edge gate regions and a body connection implant that includes edge body connection implant region, including, but not limited to, the FETs in FIGS. 2-4B and 6-7 and circuits in FIGS. 3-4B and 6-7, and according to any of the aspects disclosed herein. In this example, the processor-based system 1000 may be formed as an IC 1004 in an IC package 1002 and as a system-on-a-chip (SoC) 1006. The processor-based system 1000 includes a CPU 1008 that includes one or more processors 1010, which may also be referred to as CPU cores or processor cores. The CPU 1008 may have cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016 as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. Each of the memory system 1020, the one or more input devices 1022, the one or more output devices 1024, the one or more network interface devices 1026, and the one or more display controllers 1028 can be provided in the same or different IC packages 1002. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display controller(s) 1028 and video processor(s) 1034 can be included as ICs in the same or different IC packages 1002, and in the same or different IC package 1002 containing the CPU 1008 as an example. The display(s) 1032 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated. Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A field-effect transistor (FET), comprising:
a semiconductor body comprising a semiconductor material, the semiconductor body comprising a first edge;
a gate disposed above the semiconductor body, the gate comprising:
a central gate region disposed above a first region of the semiconductor body to form a central conduction channel in the first region of the semiconductor body, the central gate region disposed along a first longitudinal axis and having a first end and a second end opposite the first end, the central gate region having a first length along a second longitudinal axis orthogonal to the first longitudinal axis; and
an edge gate region overlying the first edge of the semiconductor body to form an edge conduction channel around the first edge of the semiconductor body,
the edge gate region disposed in a direction of the second longitudinal axis orthogonal to the first longitudinal axis, and disposed adjacent to the first end of the central gate region, the edge gate region having a second length longer than the first length, wherein a work function of the edge gate region is equal to a work function of the central gate region;
a source region of a first polarity within the semiconductor body and disposed on a first side of the central conduction channel along a third longitudinal axis parallel to the first longitudinal axis;
a drain region of the first polarity within the semiconductor body and disposed on a second side of the central conduction channel opposite the first side of the central conduction channel and along a fourth longitudinal axis parallel to the third longitudinal axis;
a central transistor defined by the central gate region disposed over the semiconductor body, the central transistor having a first threshold voltage;
an edge transistor defined by the edge gate region disposed over the semiconductor body, the edge transistor having a second threshold voltage; and
an implant of a second polarity opposite the first polarity, the implant comprising:
a central implant region coupled to the semiconductor body and disposed along a fifth longitudinal axis parallel to the third longitudinal axis and adjacent to one of the source region and the drain region, the central implant region having a first end and a second end opposite the first end; and
an edge implant region coupled to the first end of the central implant region and underlying at least a portion of the edge gate region, the edge implant region disposed along a sixth longitudinal axis parallel to the second longitudinal axis,
wherein the central implant region of the implant comprises a body connection implant electrically coupled to one of the source region and the drain region, and the semiconductor body and wherein a ratio of current leakage of the edge transistor to current leakage of the central transistor is at least 5.0.

2. The FET of claim 1, wherein the gate further comprises:
a second edge gate region overlying a second edge of the semiconductor body opposite the first edge to form a second edge conduction channel around the second edge of the semiconductor body, the second edge gate region disposed along a seventh longitudinal axis parallel to the second longitudinal axis, and disposed adjacent to the second end of the central gate region, the second edge gate region having a third length longer than the first length.

3. The FET of claim 2, wherein the third length of the second edge gate region is equal to the second length of the edge gate region.

4. The FET of claim 2, wherein the implant further comprises:
a second edge implant region coupled to the second end of the central implant region and underlying at least a portion of the second edge gate region, the second edge implant region disposed along an eighth longitudinal axis parallel to the second longitudinal axis.

5. The FET of claim 1, further comprising:
a substrate; and
a buried oxide (BOX) layer disposed on the substrate;
the semiconductor body disposed on the BOX layer.

6. The FET of claim 1, wherein the second threshold voltage is equal to or greater than the first threshold voltage.

7. The FET of claim 1, wherein the second threshold voltage is at least 300 millivolts (mV) higher than the first threshold voltage.

8. The FET of claim 1, wherein a ratio of the second threshold voltage to the first threshold voltage is at least 1.5.

9. The FET of claim 1, wherein the second length of the edge gate region is at least 0.1 micrometers (μm) longer than the first length of the central gate region.

10. The FET of claim 1, wherein a ratio of the second length of the edge gate region to the first length of the central gate region is at least 1.02.

11. The FET of claim 1, wherein:
the semiconductor body comprises an N-well;
the source region comprises a P-type source region;
the drain region comprises a P-type drain region;
the central conduction channel comprises an N-type central conduction channel;
the edge conduction channel comprises an N-type edge conduction channel; and
the implant comprises an N-type material.

12. The FET of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *